United States Patent [19]

Brun et al.

[11] 4,262,307

[45] Apr. 14, 1981

[54] FINE TUNING CIRCUIT

[75] Inventors: Craig W. Brun, Honeoye Falls; Wilfred L. Hand, Clarence, both of N.Y.

[73] Assignee: GTE Products Corporation, Stamford, Conn.

[21] Appl. No.: 963,879

[22] Filed: Nov. 27, 1978

[51] Int. Cl.³ ............................................. H04N 5/50
[52] U.S. Cl. .............................. 358/195.1; 358/191.1; 455/182
[58] Field of Search ................. 358/191, 195; 325/458, 325/459, 464, 470; 455/182, 192, 195

[56] References Cited

PUBLICATIONS

A. Hashima "A Television Tuning Method With Automatic Band Switching", *Transactions on Joint Conference of W. Japanese Branches of Electrical & Electronic Engineering*, Oct. 20, 1978.

*Primary Examiner*—Richard Murray
*Attorney, Agent, or Firm*—John A. Odozynski

[57] ABSTRACT

A circuit for applying a fine tuning voltage to an oscillator operating within distinct ranges of frequency. The fine tuning voltage is tailored so that a substantially equal fine tuning range, for example, ±1.5 MHz, is achieved with respect to each of the ranges of frequency. The circuit includes a potentiometer that is connected between two voltage sources. The values of the voltage sources are appropriately varied in response bandswitch information. In a television receiver the values are varied in response to a signal indicating operation on a Low Band VHF, a High Band VHF, or a UHF channel.

28 Claims, 1 Drawing Figure

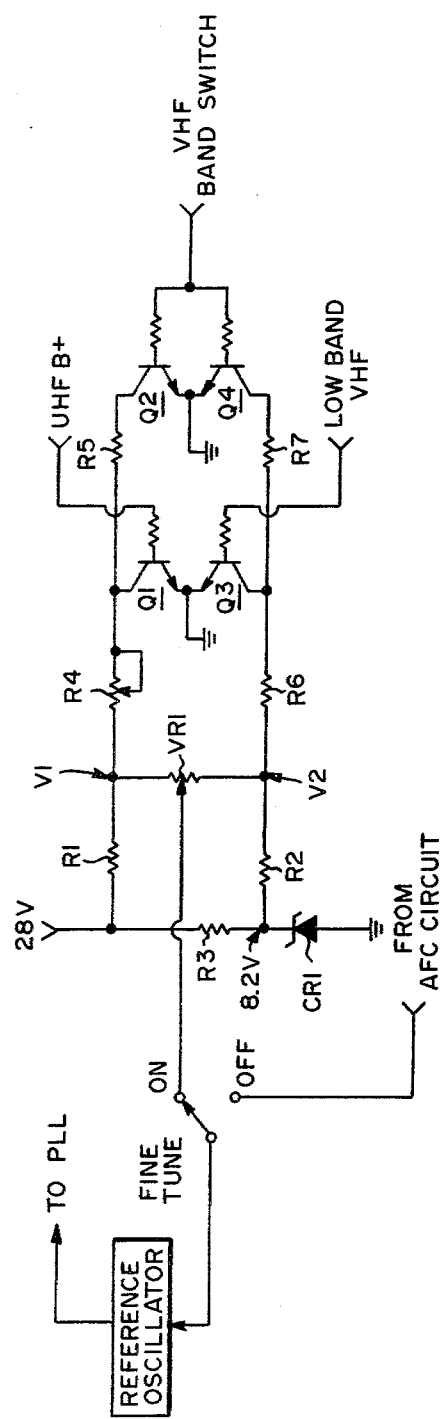

FINE TUNING CIRCUIT

FIELD OF THE INVENTION

This invention relates to oscillator tuning systems and more particularly to a fine tuning circuit that maintains substantially constant fine tuning range as the oscillator operating frequency is varied among distinct bands of frequencies.

BACKGROUND OF THE INVENTION

U.S. Patent Application entitled "AFC System For A Synthesizer Tuning System," Ser. No. 956,955, filed Nov. 2, 1978, by the same inventors and assigned to the same assignee as this application and hereby incorporated by reference, discloses a voltage-controllable reference oscillator for a synthesized television receiver local oscillator (LO). The reference oscillator has a nominal 4 MHz operating frequency and its output is effectively frequency divided and compared, according to well known Phase-Locked Loop (PLL) frequency synthesis techniques, to an appropriately divided sample of the LO signal so as to generate the desired LO frequencies, 101 to 129 MHz on Low Band VHF channels 2 through 6, 221 to 257 MHz on High Band VHF channel 7 through 13, and 517 to 931 MHz on UHF channels 14 through 83. The resulting LO frequency is at all times a rational multiple of the 4 MHz reference oscillator frequency.

The reference oscillator is capable of operation in an injection-locked mode whereby its output frequency is determined by a highly stable 4 MHz crystal oscillator to which the reference oscillator is injection-locked. However, when receiving nonstandard frequency signals such as those provided by some CATV and MATV sources, and home video games it is desirable that the reference oscillator frequency be continuously variable, over a limited range, according to the voltage applied to its tuning voltage control terminal. In the voltage-controlled mode of operation the tuning voltage may be derived from either an AFC control circuit or a manually variable Fine Tuning circuit. The U.S. Pat. Application referred to above illustrates a Fine Tuning circuit, element 5 therein, as a variable resistor coupled between two voltage sources, V1 and V2. Although that circuit is unquestionably effective for its intended purpose, there are instances, as described below, when it is useful to effect the fine tuning function in a somewhat more sophisticated manner. For example, it has been found desirable to maintain the fine tuning range at approximately ±1.5 MHz, regardless of the channel on which the receiver is operating. However, because the 4 MHz reference oscillator is multiplied by a variable factor that depends on the desired local oscillator frequency for the selected channel, it is not sufficient to maintain a fixed reference oscillator fine tuning range for all channels. To illustrate, on Channel 2 the nominal local oscillator frequency is 101 MHz and the reference oscillator will be effectively multiplied by a factor of 25.25 to achieve the desired LO frequency. In order to implement a fine tuning range of ±1.5 MHz, it is necessary to vary the reference oscillator frequency only approximately ±60 KHz (±1.5 MHz/25.25). However, on UHF channel 83 the LO frequency is 931 MHz and the multiplying factor is 232.75. A 60 KHz deviation of the reference oscillator would result in almost a 14 MHz deviation, that is, fine tuning range, of the LO frequency. Such a range, greater than four channel widths, is clearly excessive. For the reference oscillator illustrated referred to above, empirical investigation indicated that limiting the range of fine tuning voltage to 2 to 28 volts on Low Band VHF channels 2 through 6, 6 to 18 volts on High Band VHF channels 7 through 13, and 8 to 12 volts on UHF channels 14 through 83, would maintain adequately uniform fine tuning range on all channels.

OBJECTS OF THE INVENTION

It is an object of this invention to provide fine tuning for a voltage-controllable oscillator.

It is a further object of this invention to maintain substantially uniform fine tuning range as the oscillator operating frequency is varied among distinct bands of frequencies.

In a television receiver, it is an object of this invention to maintain a tuning range of approximately ±1.5 MHz as the receiver is switched to operation on a Low Band VHF, a High Band VHF, or a UHF channel.

To this end, it is an object of this invention to tailor the amount of fine tuning voltage available in response to a signal indicating the range of frequencies within which the oscillator is operating.

BRIEF DESCRIPTION OF THE DRAWING

The sole drawing is a schematic diagram of the subject fine tuning circuit.

DESCRIPTION OF THE PREFERRED EMBODIMENT

For a better understanding of the present invention, together with other and further objects, advantages and capabilities thereof, reference is made to the following disclosure and appended claims in connection with the above-described drawing.

Referring now to the drawing, the fine tuning circuit comprises a potentiometer, VR1, having a wiper coupled to the ON terminal of a FINE TUNE switch. The OFF terminal of the switch is coupled to an AFC control circuit and the pole of the switch is coupled to the reference oscillator tuning voltage control terminal. One end of VR1 is coupled through a 3.9 K ohm resistor, R1, to a 28-volt voltage source and the other end is coupled through a 1.5 K ohm resistor, R2, to an 8.2-volt voltage source. The 8.2-volt source may be developed by coupling the 28-volt source through a 1 K ohm resistor, R3, to the cathode of an 8.2-volt Zener diode CR1. The anode of CR1 is connected to ground. In a manner described below, the voltages, V1 and V2 respectively, applied to the ends of VR1 are varied so as to limit the amount of fine tuning voltage available at tuning voltage control terminal and, hence, limit the fine tuning range. The V1 end of VR1 is coupled through a variable 3.0 K ohm resistor, R4, to the collector of a transistor, Q1. The collector of Q1 is coupled through a 4.3 K ohm resistor, R5, to the collector of a transistor, Q2. The base of Q1 is coupled to a UHF B+ that is +24 volts during operation on a UHF channel and otherwise ground. The base of Q2 is coupled to a VHF Bandswitch voltage that is 0 volts during operation on a Low Band VHF channel and +24 volts during operation on a High Band VHF channel. The emitters of Q1 and Q2 are connected to ground. The V2 end of VR1 is coupled through a 510 ohm resistor, R6, to the collector of a transistor, Q3. The collector of Q3 is coupled through a 3.9 K ohm resistor, R7, to the collector of a transistor, Q4. The base of Q3 is coupled to a Low Band VHF voltage that is +5 volts during operation on a Low Band VHF channel and otherwise 0 volts. The base of Q4 is coupled to the VHF Bandswitch voltage. The emitters of Q3 and Q4 are connected to ground. From the above it can be seen that Q1 conducts only during operation on a UHF channel, Q2 and Q4 conduct only during operation on a High Band VHF channel, and Q3 conducts only during operation on a Low Band VHF channel. To simplify this analysis it can be assumed that these devices are equivalent to a closed switch (to ground) when conducting and an open switch when not conducting. In general they operate to appropriately vary the effective resistance between the ends of VR1 and ground in response to UHF B+, VHF Bandswitch, and Low Band VHF voltages and in so doing vary V1 and V2 in response to an indication as to the band of channels, (that is, range of frequencies) on which the receiver is operating. Table 1 indicates theoretical values for V1 and V2 according to the receiver's operating frequency. With RA and RB representing the effective resistances to ground from V1 end and V2 end of VR1 respectively, it can be seen that the approximate general expressions for V1 and V2 are the following:

$$V1 = \frac{28V \times RA}{RA + R1}, \text{ and}$$
$$V2 = \frac{8.2V \times RB}{RB + R2},$$

where R1 and R2 are always equal to 3.9 K ohm and 1.5 Kohm, respectively, and where the value of R4 is taken to be 3.0 K ohm. In addition to the assuming that Q1, Q2, Q3, and Q4 are ideally either opened or closed switches, it is assumed that the effect of VR1 can be ignored. This is deemed reasonable because the resistance of VR1, 100 K ohm, is approximately two orders of magnitude greater than the resistance between either end and ground. It can be seen that the calculated values for V1 and V2 in Table I closely approximate the values specified above.

TABLE I

|  | RA | V1 | RB | V2 |
|---|---|---|---|---|
| Low Band VHF | 00 | 28.0v | 510 | 2.0v |
| High Band VHF | 7.3K | 18.2v | 4.4K | 6.1v |
| UHF | 3.0K | 12.2v | 00 | 8.2v |

Although this invention has been described in conjunction with a voltage-controllable reference oscillator, it is obvious that those having ordinary skill in the art of electronic circuit design will recognize its applicability in less esoteric areas, for example, in conjunction with conventionally fine tuned LO circuits or with voltage-controllable circuits in general.

Accordingly, while there has been shown and described what are at present considered the preferred embodiments of the invention, it will be obvious to those skilled in the art that various changes and modifications may be made therein without departing from the scope of the invention as defined by the appended claims.

What is claimed is:

1. A fine tuning circuit for a voltage-controllable oscillator, the circuit comprising:
   a fine tuning potentiometer having a wiper coupled to the oscillator tuning voltage control terminal and first and second ends respectively resistively coupled to first and second voltage sources;
   first means for switching the voltage applied to the first end of the fine tuning potentiometer in response to a signal indicative of the oscillator's operating frequency so as to establish a first limit on the fine tuning voltage available at the tuning control terminal; and
   second means for switching the voltage applied to the second end of the fine tuning potentiometer in response to a signal indicative of the oscillator's operating frequency so as to establish a second limit on the fine tuning voltage available at the tuning control terminal.

2. A circuit as defined in claim 1 wherein the value of the first voltage source is greater than the value of the second voltage source so that the first means establishes the maximum fine tuning voltage available and the second means establishes the minimum fine tuning voltage available.

3. A circuit as defined in claim 2 wherein the first means comprises:
   a first resistance coupled between the first end of the potentiometer and the first voltage source,
   a second resistance coupled to the first resistance; and
   a first switchable resistance coupled between the second resistance and a reference potential.

4. A circuit as defined in either claim 3 or claim 5 wherein the first switchable resistance comprises a semiconductor device that is rendered conductive in response to a signal indicating a first range of oscillator operating frequency and nonconductive in response to a signal indicating a second range of oscillator operating frequency.

5. A circuit as defined in claim 3 wherein the second means comprises:
   a third resistance coupled between the second end of the potentiometer and the second voltage source;
   a fourth resistance coupled to the second resistance; and
   a second switchable resistance coupled between the second resistance and a reference potential.

6. A circuit as defined in claim 5 wherein the first switchable resistance comprises a semiconductor device rendered in one state of conduction in response to a signal indicating a first range of oscillator operating frequency and in an alternate state of conduction in response to a signal indicating a second range of oscillator operating frequency and wherein the second switchable resistance comprises a semiconductor device rendered in one state of conduction in response to a signal indicating a first range of oscillator operating frequency and in an alternate state of conductivity in response to a signal indicative of a second range of oscillator operating frequency.

7. A circuit as defined in claim 6 wherein the fourth resistance comprises series-connected resistors, thereby forming a first resistive junction.

8. A circuit as defined in claim 7 wherein the first resistive junction is coupled to the reference potential through a third switchable resistance.

9. A circuit as defined in claim 8 wherein the third switchable resistance comprises a semiconductor device that is rendered in one state of conduction in response to a signal indicating the first range of oscillator operating frequency and in an alternate state of conduction in response to a signal indicating the second range of oscillator operating frequency.

10. A circuit as defined in claim 9 wherein the first and second switchable resistances are so arranged and constructed that the semiconductor devices comprised therein are always in the same state of conduction and wherein the third switchable resistance is so arranged and constructed that the semiconductor device comprised therein is in a state of conduction opposite to the state of conduction of the semiconductor devices comprised by the first and second switchable resistances.

11. A circuit as defined in claim 10 wherein the second resistance comprises series-connected resistors, thereby forming a second resistive junction.

12. A circuit as defined in claim 11 wherein the second resistive junction is coupled to the reference potential through a fourth switchable resistance.

13. A circuit as defined in claim 12 wherein the fourth switchable resistance comprises a semiconductor device that is rendered in one state of conduction in response to a signal indicating a third range of local oscillator operating frequency and in an alternate state of conduction in response to a signal indicating another range of oscillator operating frequency.

14. A circuit as defined in claim 10 wherein the semiconductor devices comprised by the first and second switchable resistances are rendered nonconductive in response to a signal indicating the first range of oscillator operating frequency so that the maximum fine tuning voltage available during operation within the first range of oscillator operating frequency is greater than the maximum fine tuning voltage available during operation within the second range of oscillator operating frequency and the minimum fine tuning voltage available during operation within the first range of oscillator operating frequency is less than the minimum fine tuning voltage available during operation within the second range of oscillator operating frequency.

15. A circuit as defined in either claim 13 or 14 wherein the first, second and third switchable resistances are so arranged and constructed that the semiconductor devices comprised therein are rendered nonconductive in response to a signal indicating the third range of oscillator operating frequency and the fourth switchable resistance is so arranged and constructed that the semiconductor device comprised therein is rendered conductive in response to a signal indicating the third range of oscillator operating frequency so that the maximum fine tuning voltage available during operation within the third range of oscillator operating frequency is less than the maximum fine tuning voltages available during operation within the first or second ranges of oscillator operating frequency and the minimum fine tuning voltage available during operation within the third range of oscillator operating frequency is greater than the minimum fine tuning voltages available during operation within the first or second ranges of oscillator operating frequency.

16. A circuit as defined in claim 15 wherein the second resistance comprises a variable resistor coupled between the first end of the fine tuning potentiometer and the fourth switchable resistance for varying the maximum fine tuning voltage available during operation with the third range of oscillator operating frequency.

17. A fine tuning circuit for a television receiver voltage-controllable local oscillator signal source comprising:
a potentiometer having a wiper coupled to the oscillator tuning voltage control terminal;
a first voltage source;
a first resistance coupled between the first voltage source and a first end of the potentiometer for establishing a voltage, V1, at that end;
a second voltage source;
a second resistance coupled between the second voltage source and a second end of the potentiometer for establishing a voltage, V2, at that end; and
first switchable resistance means coupled between the first end and a reference potential for varying V1; and
second switchable resistance means coupled between the second end and the reference potential for varying V2.

18. A fine tuning circuit as defined in claim 17 wherein the first switchable resistance means comprises:
a third resistance coupled to the first end;
a first semiconductor device coupled between the third resistance and the reference potential and responsive to a VHF Bandswitch voltage.

19. A fine tuning circuit as defined in claim 18 wherein the second switchable resistance means comprises:
a fourth resistance coupled to the second end;
a second semiconductor device coupled between the fourth resistance and the reference potential and responsive to a VHF Bandswitch voltage.

20. A fine tuning circuit as defined in claim 19 wherein the first and second semiconductor devices are conductive during operation on a High Band VHF channel, thereby respectively coupling the third and fourth resistances to the reference potential and respectively determining the values of V1 and V2 during operation on a High Band VHF channel.

21. A fine tuning circuit as defined in claim 20 wherein the second switchable resistance means comprises:
a first resistor coupled to the second end;
a second resistor connected to the first resistor and coupled to the second semiconductor device; and
a third semiconductor device coupled between the junction of the first and second resistors and the reference potential and responsive to a Low Band VHF voltage.

22. A fine tuning circuit as defined in claim 21 wherein the third semiconductor device is conductive on a Low Band VHF channel, thereby coupling the first resistor between the second end and the reference potential and determining the value of V2 during operation on a Low Band VHF channel.

23. A fine tuning circuit as defined in claim 21 wherein the first switchable resistance means comprises:
a third resistor coupled to the first end;
a fourth resistor connected to the third resistor and coupled to the first semiconductor device;
a fourth semiconductor device coupled between the the junction of the third and fourth resistors and the reference potential and responsive to a UHF B+ voltage.

24. A fine tuning circuit as defined in claim 23 wherein the fourth semiconductor device is conductive during operation on a UHF channel, thereby coupling the third resistor between the first end and the reference potential and determining the value of V1 during operation on a UHF channel.

25. A fine tuning circuit as defined in claim 24 wherein the third resistor is a variable resistor.

26. A fine tuning circuit for a television receiver comprising:
- a potentiometer having first and second ends resistively coupled to first and second voltage sources so that voltages, V1 and V2 respectively, are applied to those ends;
- a first resistance coupled to the first end;
- first VHF Bandswitch means coupled between the other end of the first resistance and a reference potential and responsive to a VHF Bandswitch voltage so that V1 has one value during operation on a Low Band VHF channel and another value during operation on a High Band VHF channel;
- a second resistance coupled to the second end and second VHF Bandswitch means coupled between the second resistance and the reference potential and responsive to a VHF Bandswitch voltage so that V2 has one value during operation on a Low Band VHF channel and another value during operation on a High Band VHF channel.

27. A fine tuning circuit as defined in claim 26 wherein:
(1) the second resistance comprises: two series-connected resistors, one coupled to the second end of the fine tuning potentiometer; and
(2) the second VHF Bandswitch means comprises: Low Band switch means coupled between the junction of the resistor and the reference potential for establishing the value of V2 during operation on a Low Band VHF channel, and
High Band switch means coupled between the other resistor and the reference potential for establishing the value of V2 during operation on a High Band VHF channel.

28. A fine tuning circuit for a television receiver comprising:
- a potentiometer having a wiper coupled to a tuning voltage control terminal and first and second ends respectively coupled to first and second voltage sources;
- a first resistor coupled between the first voltage source and the first end for varying the voltage, V1, applied to that end;
- a second resistor coupled between the second voltage source and the second end for varying the voltage, V2, applied to that end; and
- Bandswitch means coupled between the first resistor and a reference potential and between the second resistor and the reference potential and responsive to a signal indicative of the range of frequencies within which the receiver is operating so that V1 and V2 have predetermined values during operation within one range of frequencies and different values during operation with another range of frequencies.

* * * * *